(12) United States Patent
Tokushige et al.

(10) Patent No.: US 6,555,459 B1
(45) Date of Patent: Apr. 29, 2003

(54) METHOD OF MANUFACTURING A SEMICONDUCTOR DEVICE

(75) Inventors: Ryoji Tokushige, Gunma (JP); Nobuyuki Takai, Gunma (JP); Hiroyuki Shinogi, Gunma (JP); Seiichi Ono, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/491,033

(22) Filed: Jan. 25, 2000

(30) Foreign Application Priority Data

Jan. 25, 1999 (JP) ............................................. 11-015947

(51) Int. Cl.⁷ .......................... H01L 21/00; H01L 21/44
(52) U.S. Cl. ........................................ 438/612; 438/614
(58) Field of Search .............................. 438/612, 613, 438/614; 257/762, 781; 428/587

(56) References Cited

U.S. PATENT DOCUMENTS

| | | | | |
|---|---|---|---|---|
| 5,143,865 A | * | 9/1992 | Hideshima et al. | ......... 438/614 |
| 5,851,911 A | * | 12/1998 | Farnworth | ................... 438/614 |
| 5,953,623 A | * | 9/1999 | Boyko et al. | ................ 438/612 |
| 6,180,505 B1 | * | 1/2001 | Uzoh | ........................ 438/614 |
| 6,251,528 B1 | * | 6/2001 | Uzoh et al. | .................. 428/587 |
| 6,274,935 B2 | * | 8/2001 | Uzoh | ......................... 257/762 |
| 6,297,140 B1 | * | 10/2001 | Uzoh et al. | .................. 438/612 |
| 2001/0022403 A1 | * | 9/2001 | Lee et al. | .................... 257/781 |

OTHER PUBLICATIONS

Harper, "Electronic Packaging & Interconnection Handbook", 1991, McGraw–Hill, sec. 5.3.*

Harper, "Electronic Packaging & Interconnection Handbook", 1991, McGraw–Hill, sec. 5.3–5.9.*

Junichi Kawanishi, Nikkei Microdevices, Aug. 1998 (Japan), pp. 44–71.

* cited by examiner

Primary Examiner—William David Coleman
(74) Attorney, Agent, or Firm—Fish & Richardson P.C.

(57) ABSTRACT

A metal post used with a chip size package and barrier metal formed on the metal post are omitted. After a second opening where a wiring layer is exposed is made, a second seed layer is formed and a solder post 7 is formed with the seed layer as a plate electrode.

11 Claims, 6 Drawing Sheets

PRIOR ART

FIG.10

PRIOR ART

METHOD OF MANUFACTURING A SEMICONDUCTOR DEVICE

BACKGROUND OF THE INVENTION

1. Field of the Invention

This invention relates to a chip-size package (CSP) and a method of manufacturing thereof. The chip-size package is a generic name for packages of a size equal to or slightly larger than the chip size and is a package intended for high-density packaging. The invention relates to a metal post used in the CSP.

2. Description of the Related Art

Hitherto, in the field, a structure having a plurality of solder balls arranged like a plane, called a BGA (Ball Grid Array), a structure whose outside shape is close to the chip size by making the ball pitch of the BGA narrower, called a fine-pitch BGA, any another other structure have been known.

In recent years, a wafer CSP described in the 1998 August issue of "Nikkei Microdevice" p. 44–p. 71 has been available. This wafer CSP basically is a CSP comprising wiring and array-like pad manufactured in a wafer process (preprocess) before chip dicing. It is expected that the technology makes it possible to combine the wafer process and a package process (postprocess) into one for drastically reducing package costs.

The wafer CSPs are classified into those of seal resin type and those of rewiring type. The wafer CSP of the seal resin type has a structure with a surface coated with seal resin, like that of a conventional package, wherein a metal post is formed on a wiring layer on the chip surface and is surrounded by seal resin for fixture.

Generally, it is said that if a package is mounted on a printed wiring board, a stress generated because of the thermal expansion difference between the package and the printed wiring board concentrates on a metal post; however, in the wafer CSP of the seal resin type, it is considered that the stress is scattered because the metal post lengthens.

Figure 9:
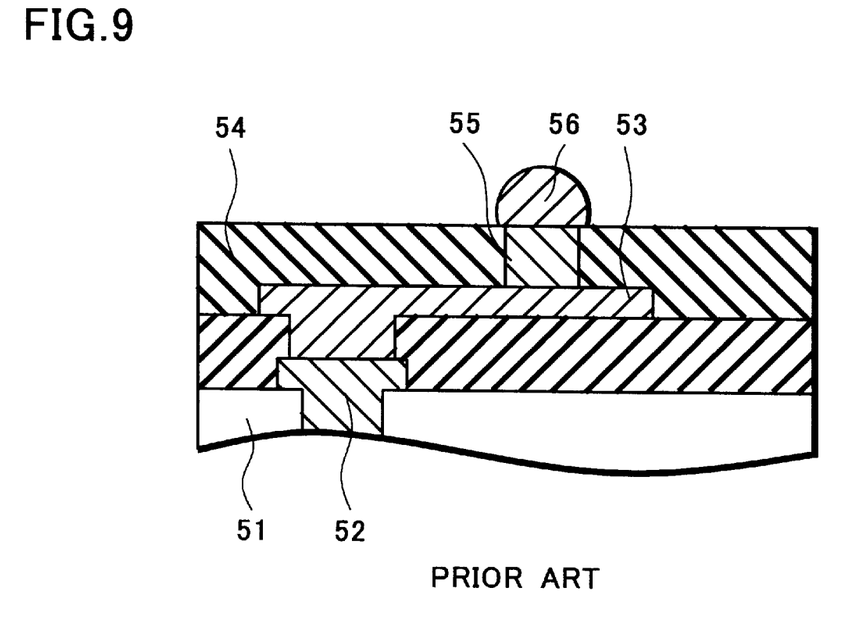
FIG. 9 is a drawing to describe a chip size package in a related art.

On the other hand, the wafer CSP of the rewiring type has a structure wherein rewiring is formed without using seal resin, as shown in FIG. 9. That is, an Al electrode 52, a wiring layer 53, and an insulating layer 54 are deposited on the surface of a chip 51, a metal post 55 is formed on the wiring layer 53, and a solder bump(ball) 56 is formed on the metal post 55. The wiring layer 53 is used as rewiring for placing the solder balls 56 like a predetermined array on the chip.

The wafer CSP of the seal resin type provides high reliability by lengthening the metal post about 100 μm and reinforcing the metal post with seal resin. However, the seal resin forming process needs to be executed with a metal mold in the postprocess and the process becomes complicated.

On the other hand, the wafer CSP of the rewiring type has the advantages that the process is comparatively simple and moreover most steps can be executed in the wafer process. However, the stress needs to be relieved for enhancing the reliability by some method.

Figure 10:
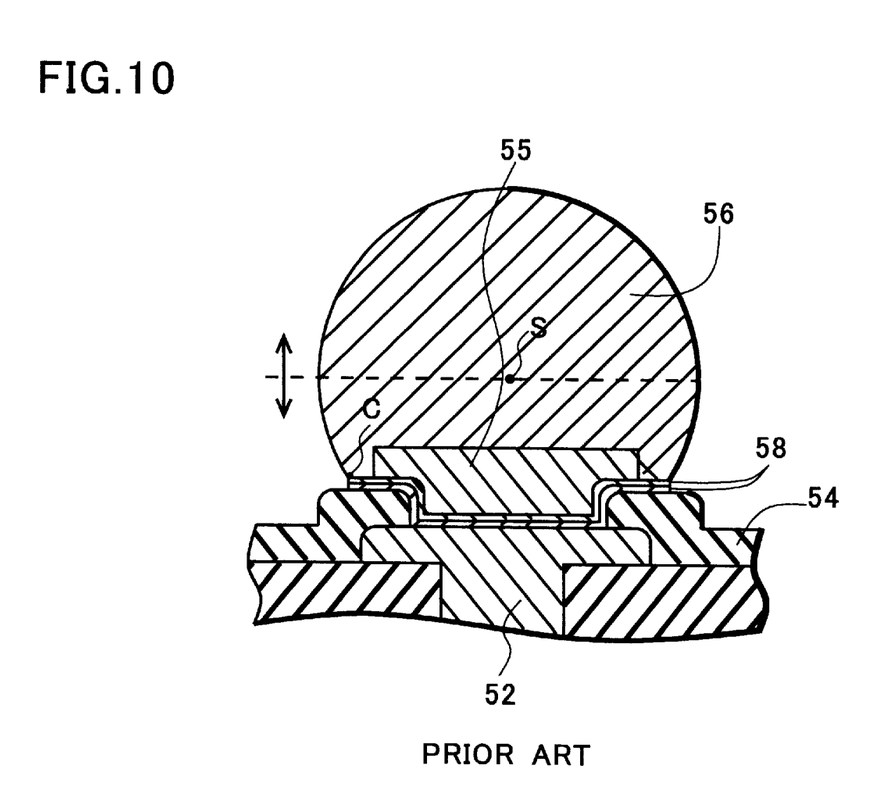
FIG. 10 is a drawing to describe the chip size package in the related art.

FIG. 10 is a drawing provided by omitting the wiring layer 53 in FIG. 9. The Al electrode 52 forms an exposed opening formed with at least one layer of barrier metal 58 between the metal post 55 and the Al electrode 52, and the solder ball 56 is formed on the metal post 55.

However, in FIGS. 9 and 10, the joint shape of the metal post 55 and the solder ball 56 substantially matches the shape of the metal post head and is a plane perpendicular to the paper plane.

On the other hand, the solder ball 56 is connected to a pattern made of Cu formed on a mounting board. Therefore, the mounting board has a thermal expansion coefficient different from that of the semiconductor device and thus a rupture stress parallel to the above-mentioned vertical plane is applied to a neck of the solder ball, cutting the neck.

Since the metal post is made of Cu, barrier metal of Ni, Au, etc., is formed on the surface of the metal post for the purpose of preventing oxidation of the surface. Therefore, adopting Au or Ni results in an increase in costs and the barrier metal is formed by plating, thus the process becomes complicated. Further, it is difficult to control the film thickness of the barrier metal, so that variations occur in adhesion of the solder balls.

SUMMARY OF THE INVENTION

It is therefore an object of the invention to provide a semiconductor device having good adhesion, a reduced number of steps, and high reliability wherein solder ball is prevented from causing neck-cutting.

To the end, in a first aspect of the invention, a metal material having wettability with solder is put on the inner face of a recess part of resin corresponding to a placement area of a metal post and solder is embedded in the area surrounded by the metal material.

In a second aspect of the invention, the metal post is formed via a metal film having wettability with the solder in the recess part.

In a third aspect of the invention, the embedded solder and a solder ball consist essentially of the same material and are molded in one piece.

In a fourth aspect of the invention, the solder surrounded by the metal film is made as a columnar structure.

Since the space in which the solder post is formed has the recess part, the joint face of the solder and the metal material is made up of the perpendicular side walls of the recess part and a horizontal plane perpendicular to the side walls. Therefore, the joint face of the perpendicular side walls and the solder has a strength against a neck cutting stress acting in the direction parallel to the horizontal plane. The interface where neck cutting occurs becomes the portion indicated by arrow S in FIG. 5; the area can be drastically reduced as compared with the semiconductor device interface in the related art and neck cutting can be suppressed.

In a fifth aspect of the invention, the metal film is a copper film and a nickel film and wherein the solder is formed via the nickel film.

In a sixth aspect of the invention, the metal film comprises a copper film, a nickel film, and a gold film deposited in order and the solder is formed via the gold film.

In a seventh aspect of the invention, the metal post is a solder area of a columnar structure formed by solder plating.

In an eighth aspect of the invention, the solder area has a bottom face formed so as to be below a depth position of a half the depth of the recess part.

According to the composition, the metal post is embedded to below the depth position of a half the depth of the recess part and the semiconductor device becomes extremely strong against a stress in a lateral direction and becomes high in adhesion.

According to a ninth aspect of the invention, there is provided a semiconductor device manufacturing method comprising the steps of:

providing a semiconductor wafer having a wiring layer connected to a metal electrode pad and consisting essentially of Cu extended on a chip surface, an insulating layer covering the chip surface containing the wiring layer, an opening made in the insulating layer on the wiring layer, and a seed layer formed on a surface containing the opening;

forming solder in the opening by a plating method with the seed layer as a plate electrode;

removing the seed layer surrounding the opening and allowing the seed layer and the solder to remain in the opening; and fixedly securing a solder ball to the remaining area.

In a tenth aspect of the invention, the seed layer is etched by polishing the semiconductor wafer or utilizing the remaining solder as an element of a mask.

In an eleventh aspect of the invention, after the wiring layer is formed, an $Si_3N_4$ film is formed, then the insulating layer is formed.

According to the composition, reaction of polyimide and Cu can be prevented and it is made possible to enhance reliability.

In a twelfth aspect of the invention, the seed layer is formed by physically cladding a thin film of Cu and further Cu is formed on the thin film of Cu by plating.

In a thirteenth aspect of the invention, the step of forming the wiring layer consisting essentially of Cu includes the step of forming a wiring layer made of Cu in an area exposed from a first opening made on the metal pad and the proximity of the area formed on an insulating layer as a lower layer covering the chip surface containing the metal electrode pad contacted to the semiconductor element.

In a fourteenth aspect of the invention, the seed layer is removed by polishing the semiconductor wafer or etching with the remaining solder utilized as an element of a mask.

In a fifteenth aspect of the invention, after the wiring layer is formed, an $Si_3N_4$ film is formed, then the insulating layer is formed.

In a sixteenth aspect of the invention, the seed layer is formed by physically cladding a Cu thin film and further Cu is formed on the Cu thin film by plating.

In a seventeenth aspect of the invention, the step of forming the seed layer includes the step of forming a copper thin film by sputtering, the copper plating step, the nickel plating step, and the gold plating step.

If a seed layer is formed in an opening and solder plating is embedded in the opening via the seed layer to form a solder post, a solder ball can be fixedly secured directly to the solder post. Therefore, it becomes unnecessary to form a metal post made of Cu and barrier metal on the metal post.

Since the Cu-plated layer and solder plate layer are formed consecutively on the extremely Cu thin film, barrier metal is unnecessary between the solder plate layer and the Cu-plated layer and most of the opening is made of the solder post, so that a solder ball can be fixedly secured substantially with no problem.

If solder plating is formed and then the surface is polished, the seed layer can also be deleted together and only the solder plating embedded in the opening can be left.

The eighteenth aspect of the invention is characterized in the compositions and melting points of the first solder material forming the bump (solder ball 8) and the second solder material forming the post 7 and particularly in that the melting point of the first solder material is set lower than that of the second solder material.

The reason why the melting point of the first solder material is set lower is that the molten solder ball becomes substantially completely spherical because a surface tension acts on a solid body and that it is determined that if the solder ball is cooled, it is fixed as a ball and is given a good shine. That is, it is determined that if the lower substance on which the solder ball is placed (the second solder material forming the post 7) is fixed, a surface tension may act on the molten conductive ball, making it possible to form a sphere substantially.

The nineteenth aspect of the invention is characterized in method of manufacturing a semiconductor device, comprising the steps of: forming an contact pad on a semiconductor substrate; and forming a bump protruded on the contact pad, wherein the melting point of a surface material of the contact pad is substantially higher than that of the bump, about 2° C. to 5° C.

DESCRIPTION OF THE PREFERRED EMBODIMENT

Referring now to the accompanying drawings, there is shown a preferred embodiment of the invention.

Embodiment 1

In the embodiment, a wiring layer 53 similar to that shown in FIG. 9 is adopted.

Figure 4:
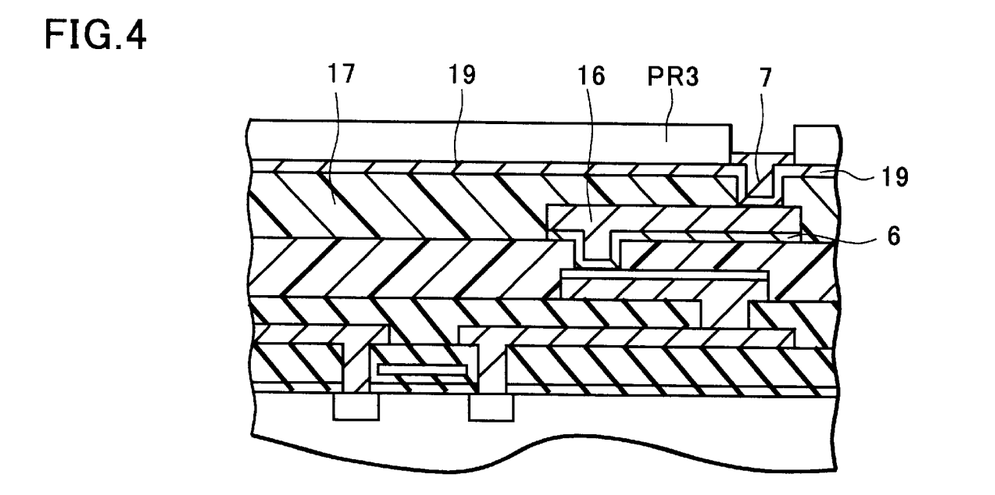
FIG. 4 is a drawing to describe the semiconductor device manufacturing method according to the embodiment of the invention.
Figure 5:
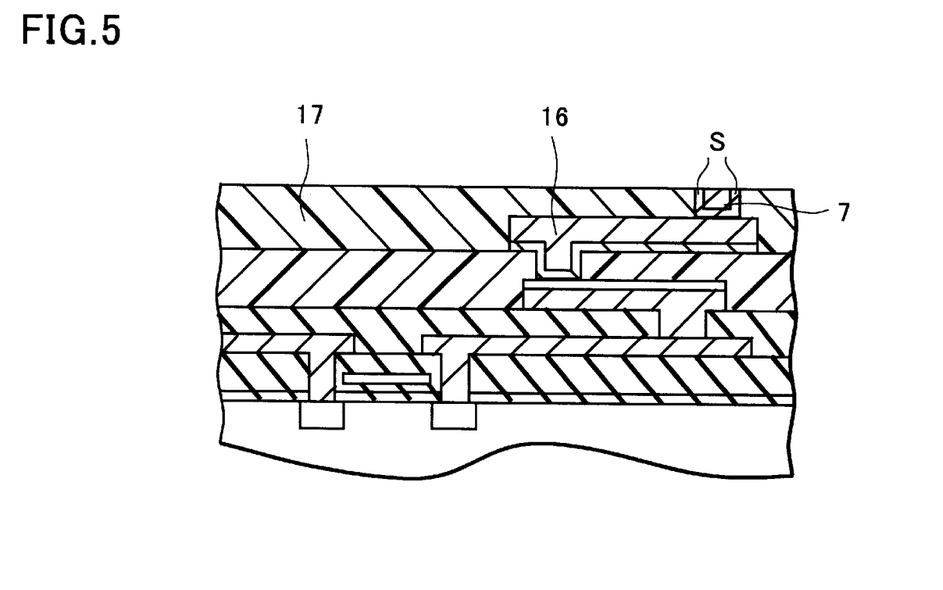
FIG. 5 is a drawing to describe the semiconductor device manufacturing method according to the embodiment of the invention.
Figure 6:
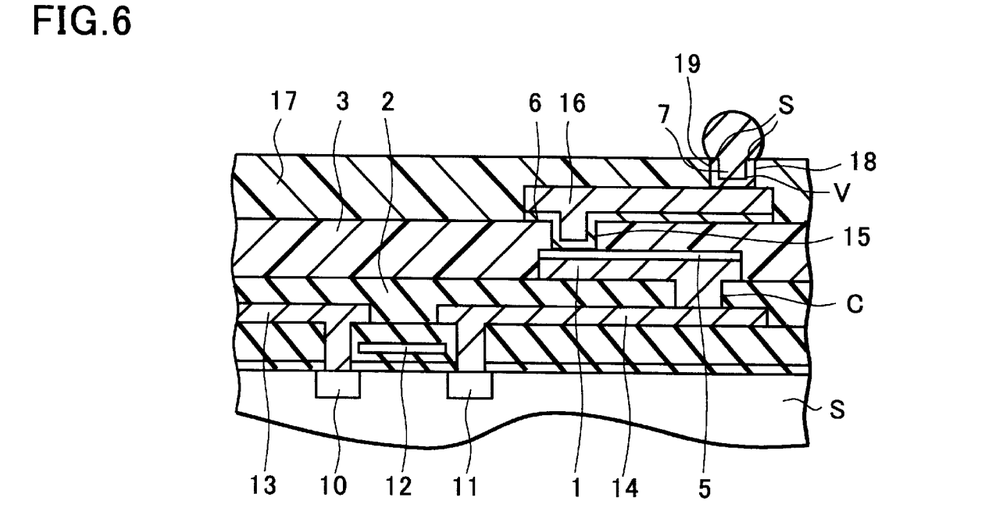
FIG. 6 is a drawing to describe the semiconductor device manufacturing method according to the embodiment of the invention.

FIG. 6 shows a transistor having two metal layers of the first embodiment, which is formed by the steps shown in FIGS. 1–5. The transistor comprises a source region 10 and a drain region 11 formed on a surface of a silicon substrate s and a gate electrode 12 formed via a gate insulating layer on a surface between the source region 10 and the drain region 11. The source region 10 is formed with a source electrode and source electrode wiring 13 and the drain region 11 is formed with a drain and drain wiring 14. As the second metal layer, an Al electrode 1 is in contact with the drain electrode 14. The connection structure of the Al electrode 1 is shown only as an example; the Al electrode 1 may be connected directly or indirectly to a diffusion region, a diode, a passive element, etc.

In IC chip of normal wire bonding type, the top metal layer (portion also functioning as a bonding pad) is denoted by numeral 1 and an interlayer insulating film formed with a contact hole C of the Al electrode 1 is denoted by numeral 2. Further, a first insulating resin layer is denoted by numeral 3. The insulating resin layer 3 is made of an epoxy resin, a polyimide resin, or the like.

The insulating resin layer 3 is provided for making the height of a solder ball 8 uniform. For example, a polyimide film is applied in a fluid state before it is cured, and is left standing for a predetermined time, so that it is cured while being flattened as it is fluid, whereby the surface can be made flat. Therefore, after it is cured, a wiring layer 16 is formed on the first insulating resin layer 3 and thus becomes flat and so long as a solder post can be formed with accuracy, the height can be made uniform and the height of the solder ball 8 can be made uniform.

A Ti nitride film 5 is formed on the Al electrode 1.

Subsequently, the first insulating resin layer 3 is formed with an opening 15 for exposing the Ti nitride film 5. Here, a thin film layer of Cu (first seed layer) 6 is formed as a wiring layer plate electrode. The wiring layer 16 plated with Cu is formed on the thin film layer 6.

Subsequently, a second insulating resin layer 17 made of an insulating resin of polyimide, etc., is formed, the wiring layer 16 is formed at an end with an opening 18, a thin film layer of Cu (second seed layer) 19 is formed as a plate electrode of the solder post 7, and the solder post 7 is formed on the thin film layer 19. The solder ball 8 is formed on the solder post 7.

The invention is characterized in the shape of the Cu thin film layer 19, namely, the solder post 7 is embedded in a recess part of the thin film layer 19.

This means that the solder ball 8 and the solder post 7 consist essentially of the same material and thus are fused in one piece by heat. Therefore, the interface between solder and Cu thin film layer where peel easily occurs is made up of vertical side walls V forming the recess part and horizontal side (bottom face and face indicated by arrow S).

A force for cutting a neck is mainly a stress in the arrow direction and for the stress, the interface formed of the vertical sides V forms the vertical side walls whose surroundings form the recess part, and is supported on the side walls, thus the strength is larger by far than that of horizontal interface. The deeper the recess part, the larger the effect. If the depth is about 100 μm or more, the effect is large, as described later.

In contrast, the horizontal face where neck cutting occurs, particularly the top face S of the thin film layer 19 exposed to the external atmosphere is determined by the film thickness of the thin film layer 19.

Here in the description, assuming that the recess part is of a columnar structure and particularly is a circular cylinder, it has a diameter of about 100 to 200 μmϕ and a height of about 50 to 150 μm. In the recess part, the thin film layer 19 is about 10 to 50 μm; as compared with the interface where neck cutting occurs in the related art, the joint interface area becomes large and the joint strength can be enhanced.

Therefore, neck cutting can be drastically decreased as compared with the type wherein the solder post is fixedly secured to the head of the metal post in the structure in the related art.

As described later, the height of solder post 7 in FIG. 7 maybe formed large as shown by the dotted line for utilization as a solder bump intact and may be fixedly secured to a mounting board. The solder post may be fused and worked to a solder ball.

Further, the solder ball 8 may be mounted and fused.

Subsequently, a manufacturing method of the structure in FIG. 6 will be discussed briefly with reference to FIGS. 1 to 6.

Figure 1:
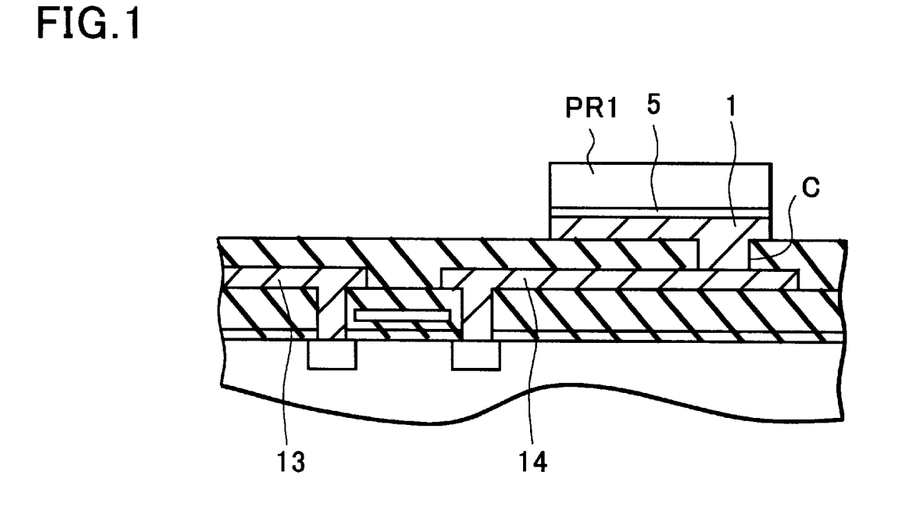
FIG. 1 is a drawing to describe a semiconductor device manufacturing method according to an embodiment of the invention.

First, a semiconductor substrate (wafer) formed with LSI having the Al electrode 1 is provided. Here, as described above, IC comprising two metal layers is formed with transistor source electrode 13 and drain electrode 14 as the first metal layer and Al electrode 1 in contact with the drain electrode 14 as the second metal layer.

Here, opening C in interlayer insulating film 2 where the drain electrode 14 is exposed is formed, then electrode material consisting mainly of Al, Ti nitride film 5, is formed on the full wafer face and the Al electrode 1 and the Ti nitride film 5 are dry-etched to a predetermined shape with photoresist PR1 as a mask. Therefore, formation can be executed at a time with the photoresist PR1 (also containing the Ti nitride film as barrier metal), making it possible to reduce the number of steps.

The Ti nitride film 5 also functions as barrier metal of Cu thin film layer (first seed layer) 6 later formed. Moreover, attention is also focused on the fact that the Ti nitride film is effective as a reflection prevention film. This means that the Ti nitride film is also effective as an antihalation film of a resist used at the patterning time. As antihalation, at least about 1200 Å to 1300 Å is preferred; to provide a barrier metal function as well as the antihalation function, about 2000 Å to 3000 Å becomes necessary. (See FIG. 1). Further, if 3000 Å is exceeded, the reflection factor becomes high and particularly to use g ray, halation becomes large.

Subsequently, an imide resin before being cured is applied to the surface of the semiconductor substrate and a wait is made for the surface to become flat, then the imide resin is cured to form first insulating resin layer 3.

The Al electrode 1 also serves as an external connection pad of the LSI. When formation as a chip size package comprising a solder ball is not executed, the Al electrode 1 functions as a wire bonding pad.

Figure 2:
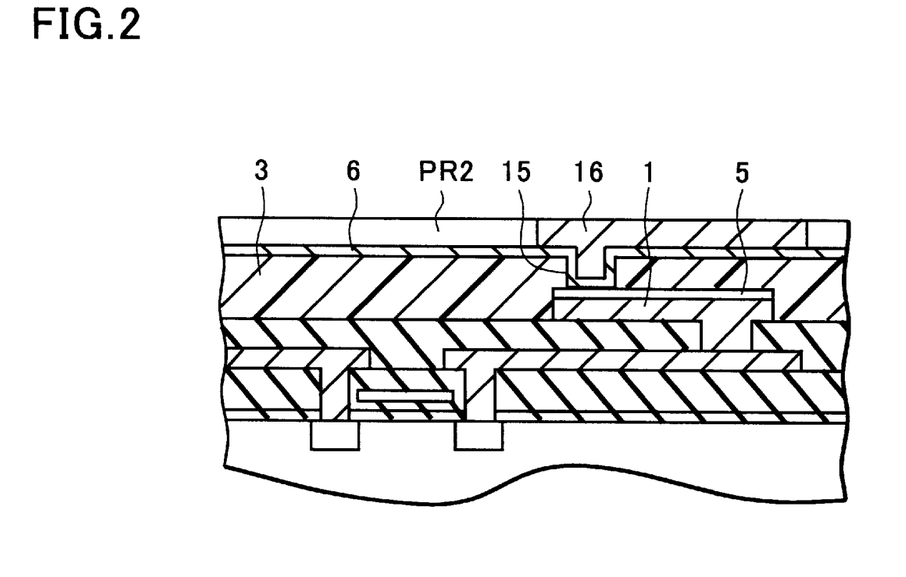
FIG. 2 is a drawing to describe the semiconductor device manufacturing method according to the embodiment of the invention.

The first insulating resin layer 3 is etched and removed so as to expose a part of the Al electrode 1, and Cu thin film layer (first seed layer) 6 is formed on the full face. The Cu thin film layer 6 will become a plate electrode of wiring layer 16 later. Here, the Cu thin film layer can be formed by either a sputtering method or an electroless plating method. If a photosensitive imide resin is adopted, the first insulating resin layer 3 can be formed with opening 15 without adopting an additional photoresist.

Subsequently, for example, a photoresist layer PR2 is applied to the full face, the portion corresponding to the wiring layer 16 is removed, and with the Cu thin film layer 6 exposed to the opening as a plate electrode, the wiring layer 16 is formed. The wiring layer 16 needs to be made thick about 5 µm to provide a mechanical strength. Here, it is formed using a plating method, but may be formed using evaporation, sputtering, etc. As described above, the first insulating resin layer 3 is a flat surface, so that a large number of wiring layers 16 formed on the wafer can be made uniform height over all area. (See FIG. 2.)

After this, the photoresist layer PR2 is removed and the Cu thin film layer 6 is etched and removed with the wiring layer 16 as a mask.

Figure 3:
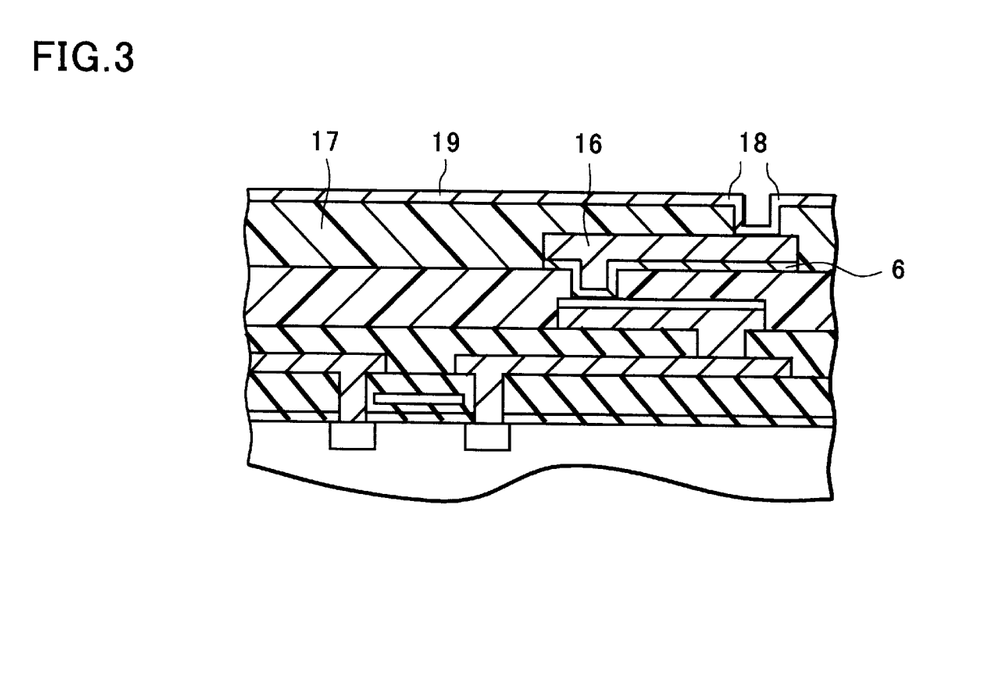
FIG. 3 is a drawing to describe the semiconductor device manufacturing method according to the embodiment of the invention.

Next, imide layer 17 is applied to the full face and an opening 18 is made in the imide layer 17 on the wiring layer 16. The imide layer 17 is photosensitive and is thermally cured after the opening is made through photomask. The film thickness after the imide layer 17 is thermally cured is about 50 µm to 150 µm. Preferably, the opening has an aperture of about 100 µm to 200 µm. The curing temperature is about 200° C.

Next, Cu thin film layer (second seed layer) 19 is formed on the full face as a plate electrode of the solder post 7. Here, it is formed by physical cladding of sputtering, etc. The first seed layer 6 is etched and does not have a seed layer function and thus the second seed layer 19 cannot be formed by electrolytic plating, but can be formed by electroless plating.

An $Si_3N_4$ film may be formed before second insulating resin layer 17 is formed, because the imide layer before being cured, to which heat is applied, reacts with Cu to produce reactants on the interface, resulting in degradation of adherence. (See FIG. 3.)

Only the Cu thin film layer 19 may be utilized as the second seed layer to form the solder post 7. However, here the Cu thin film layer 19 formed by sputtering is used as a plate electrode to further clad a Cu-plated layer (not shown).

Here, first the surface of the first seed layer 6 exposed to the opening 18 is lightly wet-etched and copper oxide on the surface is removed. When it is input to a sputtering system, reverse sputtering is executed with argon to again remove oxides and contaminants, and subsequently Cu of about 1000 Å is formed by sputtering. After this, a Cu-plated layer is formed about 15 to 50 µm. Before the Cu plating step, an oxide film on the surface of a Cu sputter film produced to the step is removed as much as possible for plating with Cu.

Generally, as Cu is oxidized, the mechanical strength with solder is reduced, thus the surface is coated with a film of Ni/Au for preventing copper oxide from being produced. Here, however, the solder post 7 is formed while the oxides are removed as described above, thus Ni/Au for oxidation prevention becomes unnecessary. Therefore, it contributes to cost reduction.

As described above, the solder post 7 is formed with the Cu sputter thin film layer and Cu-plated film as the second seed layer 19.

Here, a photoresist layer PR3 where the area of the solder post to be formed is exposed is formed and the solder post 7 is formed by electrolytic plating via the second seed layer 19. (See FIG. 4.)

This step can also be executed as the following separate step: Solder plating may be applied to the full face without forming the photoresist PR3.

Subsequently, the photoresist layer PR3 is removed and the wafer surface is polished, thereby removing the second seed layer 19.

The second seed layer may be etched with the solder post 7 as a mask before the solder post 7 is polished.

In the above-described separate step, the wafer full face may be polished to form a structure as shown in FIG. 5.

In any way, the second seed layer 19 which is extremely thin and the solder post 7 are embedded in the second opening 18 by the polishing and removing. Also, horizontal plane S where neck cutting easily occurs is formed. (See FIG. 5.)

Last, a provided solder ball 8 is fixedly secured via the solder post 7 in the second opening 18. The semiconductor substrate is divided along a scribe line in a dicing step to form chips.

The timing at which the solder ball is fixedly secured is after the first seed layer is removed and before dicing.

Embodiment 2

Figure 7:
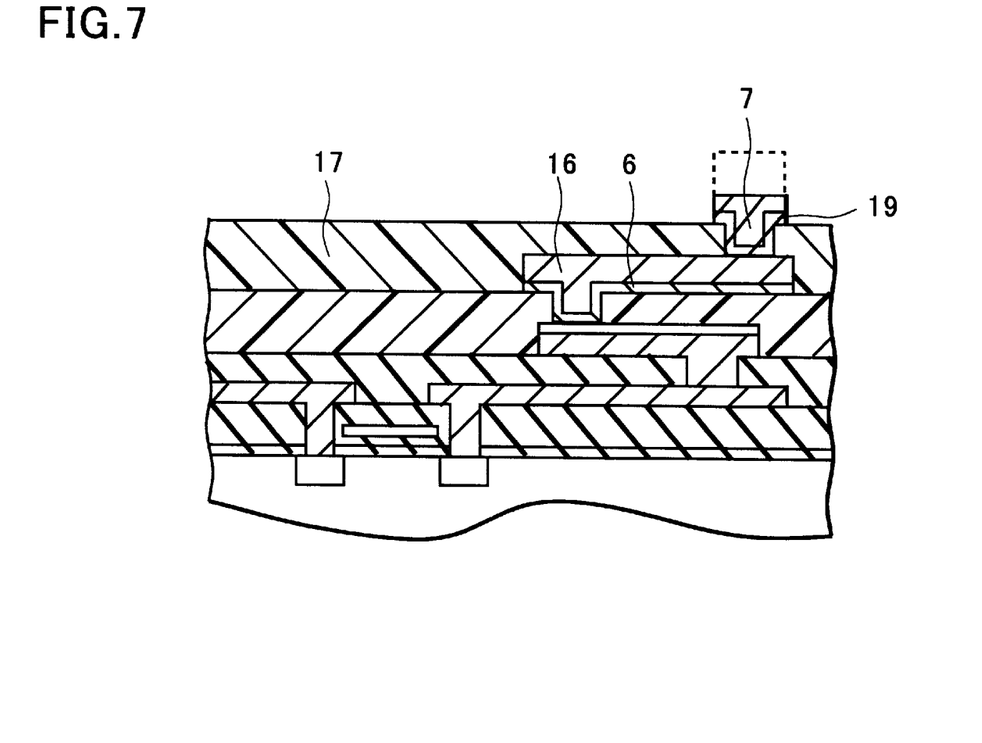
FIG. 7 is a drawing to describe the semiconductor device manufacturing method according to the second embodiment of the invention.
Figure 8:
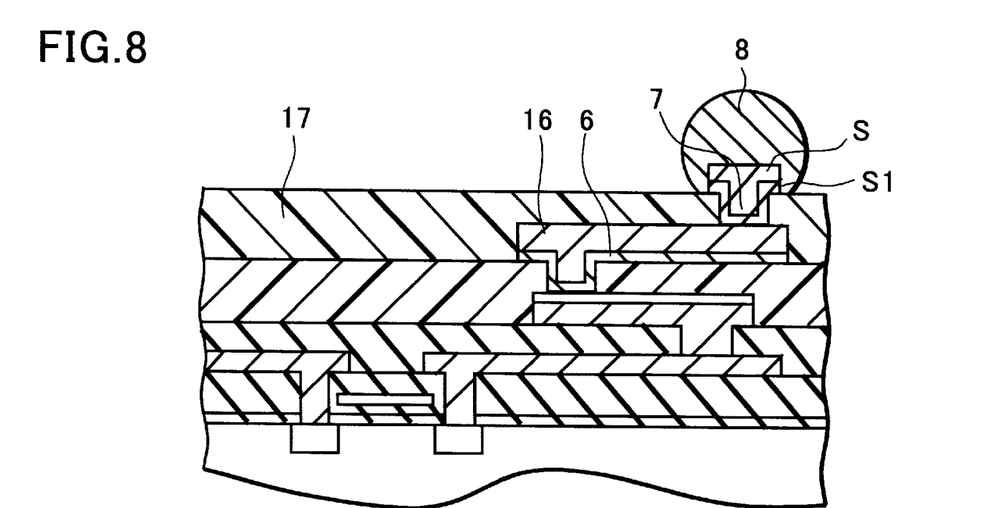
FIG. 8 is a drawing to describe the semiconductor device manufacturing method according to the second embodiment of the invention.

The solder post can also be formed by executing a process shown in FIGS. 7 and 8.

That is, after the step in FIG. 4 is executed, the photoresist PR3 is removed and the second seed layer is removed with the solder post 7 as a mask or with a mask placed on the solder post 7 and the solder post as an etching mask. Alternatively, the seed layer 19 is removed with the solder post protecting resin as a mask. In any way, the solder post is used as a mask component, self-alignment is executed, and the seed layer is removed. (See FIG. 7.)

Then, a provided solder ball 8 is placed in the solder post 7 and heat is applied for fixedly securing the solder post 7 and the solder ball 8.

In this case, the joint face of the solder ball and the second seed layer becomes as denoted by reference numeral S1 in FIG. 8. It becomes a side perpendicular to the horizontal plane and the interface of the horizontal plane S is not exposed from the solder ball, thus resulting in a structure very strong against distortion (arrow in FIG. 6) occurring when the chip is mounted on a mounting board.

In the step in FIG. 7, the solder post 7 may be formed high as indicated by the dotted line to form a solder bump serving as a solder ball. The solder bump may be fused to form a solder ball. In this case, the process becomes simpler than the process in FIGS. 7 and 8.

The invention has been described as the rewiring type, but can also be embodied as the resin seal type, needless to say.

According to the invention, the space in which the solder post is formed has the recess part, thus the joint face of the solder and the metal material is made up of the perpendicular side walls of the recess part and a horizontal plane perpendicular to the side walls. Therefore, the joint face of the perpendicular side walls and the solder has a strength against a neck cutting stress acting in the direction parallel to the horizontal plane. The interface where neck cutting occurs becomes the portion indicated by arrow S in FIG. 5; the area can be drastically reduced as compared with the semiconductor device interface in the related art and neck cutting can be suppressed.

Since the solder post is formed via the seed layer, the step of forming a metal post and forming barrier metal on the top of the metal post in the related art becomes unnecessary. Since the solder post is embedded in the opening, a solder ball can be easily fixedly secured onto the solder post. Therefore, Au, etc., is not necessary as barrier metal and costs can be reduced.

If solder plating is formed and then the solder plate surface is polished, the second seed layer can also be deleted in the step and the step can be simplified.

On the other hand, to skip the polishing step, if the second seed layer is formed comparatively thick and is projected from the second insulating resin layer, the solder ball is fused thereinto and becomes wet, so that the fixture strength of the solder ball can be enhanced.

In formation of the $Si_3N_4$ film, the adhesive property from the wiring layer to the second insulating resin layer can be improved.

Further, after the thin film layer is formed by sputtering or electroless plating, if Cu plating and solder plating are formed consecutively and the solder post is formed, the solder ball can be fused and fixed with no barrier metal.

Embodiment 3

The third embodiment of the present invention is characterized in the compositions of solder materials and melting points of the first solder material forming the bump (solder ball 8) and the second solder material forming the post 7 and particularly in that the melting point of the first solder material is set lower than that of the second solder material. In this embodiment, only composition of the solder materials is replaced to the metal post 7 and solder ball 8 of the first embodiment shown in FIG. 6.

The reason why the melting point of the first solder material is set lower is that the molten solder ball becomes substantially completely spherical because a surface tension acts on a solid body and that it is determined that if the solder ball is cooled, it is fixed as a ball and is given a good shine. That is, it is determined that if the lower substance on which the solder ball is placed (the second solder material forming the post 7) is fixed, a surface tension may act on the molten conductive ball as the above-described solder ball, making it possible to form a sphere substantially.

In an experiment, considering this point, three types of Ag—Sn family solder materials different in melting point were provided and what structures solder balls are given a good shine in were examined.

A table given below lists the result of the experiment.

TABLE

| Composition Of the post paste (Second solder material) | Composition Of the conductive ball (First solder material) | Appearance |
| --- | --- | --- |
| Ag—3.5Sn (220° C.) | Ag—3.5Sn | X spotted |
|  | Ag—3.5Sn—0.75Cu | ○ shine |
|  | Ag—3.5Sn—0.75Cu—2Bi | ○ shine |
| Ag—3.5Sn—0.75Cu (218° C.) | Ag—3.5Sn | X spotted |
|  | Ag—3.5Sn—0.75Cu | X spotted |
|  | Ag—3.5Sn—0.75Cu—2Bi | ○ shine |
| Ag—3.5Sn—0.75Cu—2Bi (215° C.) | Ag—3.5Sn | X spotted |
|  | Ag—3.5Sn—0.75Cu | X spotted |
|  | Ag—3.5Sn—0.75Cu—2Bi | X spotted |

As seen in the table, if a temperature difference in the range of 2° C. to 5° C. exits, the solder balls are given a good shine.

First, the compositions of the solder materials will be discussed. The solder materials (Pb-free solder material) not adopting Pb are used and the first solder material is represented as Ag-3.5Sn. This solder material has a melting point of about 220° C. and contains Ag and Sn as 1:3.5. The second solder material is represented as Ag-3.5Sn-0.75Cu. It has a melting point of about 218° C. and contains Ag, Sn, and Cu as 1:3.5:0.75. Further, the third solder material is represented as Ag-3.5Sn-0.75Cu-2Bi. It has a melting point of about 215° C. and contains Ag, Sn, Cu, and Bi as 1:3.5:0.75:2.

Appearance evaluation is shown under the right column of the table. The circle mark indicates that the conductive ball in all chip area is given a good shine. This means that to adopt Ag-3.5Sn as the second solder material of the post, the conductive balls having the compositions of Ag-3.5Sn-0.75Cu and Ag-3.5Sn-0.75Cu-2Bi are given a good shine. To adopt Ag-3.5Sn-0.75Cu as the second solder material of the post, the conductive ball having the composition of Ag-3.5Sn-0.75Cu-2Bi is given a good shine.

Thus, it is seen that if the melting point of the second solder material forming the post is substantially higher than that of the first solder material forming the conductive ball about 2° C. to 5° C., a conductive ball giving a good shine can be formed.

Like the above-described conductive ball, the conductive ball needs to have substantially the same composition as the post. That is, if they differ entirely in composition, the conductive ball and the post are hard to fuse on their interface.

The following three structures of conductive balls with solder material are possible: In the first structure of the conductive ball, a metal ball of Cu, etc., is coated with a solder material. The second structure of the conductive ball provides a lump-like ball integral with a solder material. In the third structure of the conductive ball, a resin ball of urethane, plastic, etc., is coated on a surface with metal and the metal coat is coated with a solder material.

Embodiment 4

Figure 12:
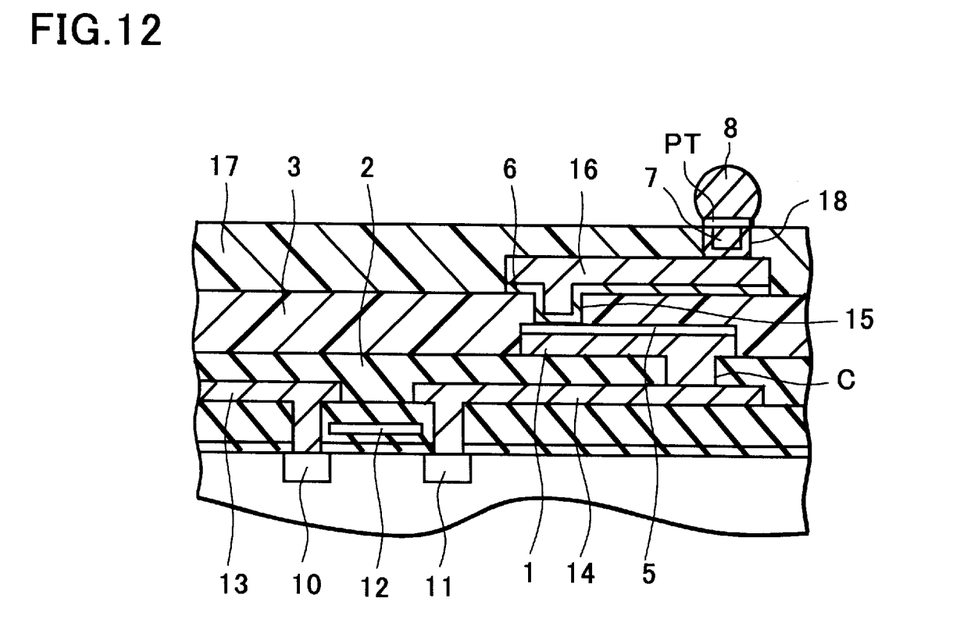
FIG. 12 is a drawing to describe the semiconductor device manufacturing method according to the fourth embodiment of the invention.

In FIG. 6, solder is used as the post; if a thin coat of paste is applied onto the post 7 of Cu and a conductive ball is placed on the paste coat, as shown in FIG. 12, the invention can also be embodied. This means that if the melting point of the second solder material forming the paste is substantially higher than that of the first solder material forming the conductive ball about 2° C. to 5° C., a conductive ball giving a good shine can be formed.

Figure 11:
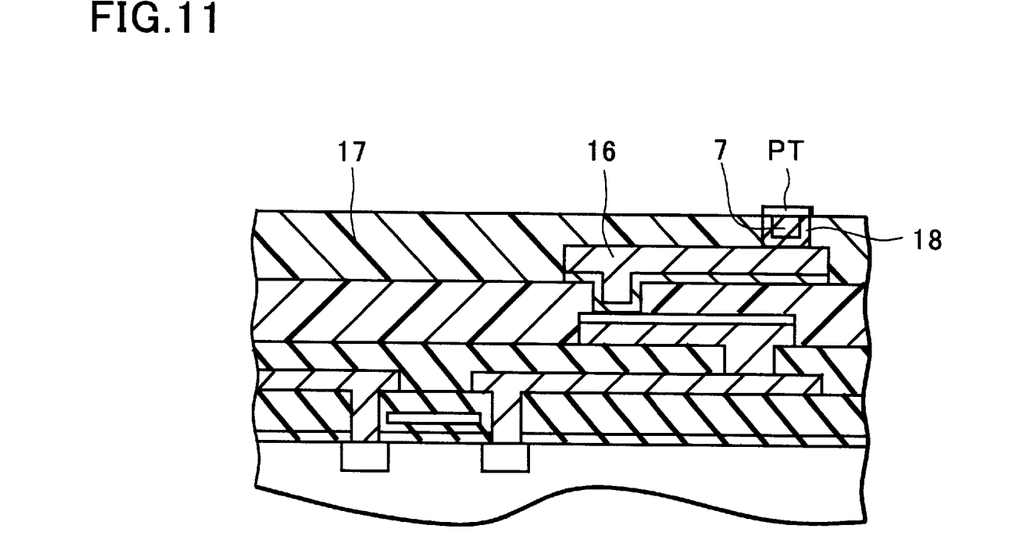
FIG. 11 is a drawing to describe the semiconductor device manufacturing method according to the fourth embodiment of the invention.

FIGS. 11 and 12 show examples of forming the post 7 of Cu.

FIG. 11 shows a state in which the post 7 is formed of Cu and the post 7 and the second insulating resin layer 17 are polished.

Before the conductive ball 8 is placed, conductive paste PT is applied, because the conductive ball 8 is temporarily fixed due to adhesion of the paste.

As shown in FIG. 12, the conductive ball 8 is placed on the post 7 and the conductive paste PT and the conductive ball 8 are fused.

Here, when the composition of the paste PT is Ag-3.5Sn, preferably the composition of the conductive ball 8 is Ag-3.5Sn-0.75Cu or Ag-3.5Sn-0.75Cu-2Bi. When the composition of the paste PT is Ag-3.5Sn-0.75Cu, preferably the composition of the conductive ball 8 is Ag-3.5Sn-0.75Cu-2Bi.

To adopt such compositions, the past PT is first hardened, so that the conductive ball 8 becomes spherical and can be given a good shine.

Since the post made of a solder material is embedded in the opening, the ball made of a solder material can be easily fixedly secured there onto.

If the post is formed and then the surface of the post is polished, the second seed layer can also be removed together in the step and the step can be simplified.

Further, since the melting point of the solder material forming the conductive ball is set lower than that of the solder material forming the post, the conductive ball is given a good shine for facilitating optical recognition, and the packaging (mounting) accuracy of semiconductor devices on a mount board is enhanced.

Since the conductive ball is given a better shine, conductive balls given no shine can be recognized as defective pieces and the yield of the semiconductor devices can be increased. Therefore in the case that this semiconductor device is mounted on the printed circuit board, since these solder balls can be sensed optically very well, it is easy to sense the position and it can be applicable to automated mounting apparatus.

What is claimed is:

1. A method of manufacturing a semiconductor device comprising the steps of:

providing a semiconductor wafer having a wiring layer made in contact with an electrode pad and consisting essentially of Cu extended on a chip surface, an insulating layer covering the chip surface containing the wiring layer, an opening made in the insulating layer on the wiring layer, and a seed layer formed on a surface containing an inner surface of the opening;

forming solder in the opening by a plating method with the seed layer as a plate electrode;

removing the seed layer surrounding the opening and allowing the seed layer and the solder to remain in the opening; and fixedly securing a solder ball on the solder remained.

2. The method of manufacturing a semiconductor device as claimed in claim 1, wherein the step of removing the seed layer comprises the step of polishing the semiconductor wafer or etching the seed layer by using the remained solder as an element of a mask.

3. The method of manufacturing a semiconductor device as claimed in claim 1, further comprising the step of forming an $Si_3N_4$ film after the step of forming the wiring layer, prior to the step of forming the insulating layer.

4. The method of manufacturing a semiconductor device as claimed in claim 1, wherein the step of forming the seed layer comprises the step of physically depositing a Cu thin film and further the step of forming a Cu film on the Cu thin film by plating.

5. The method of manufacturing a semiconductor device as claimed in claim 1, wherein the step of forming the wiring layer consisting essentially of Cu includes the step of forming a wiring layer made of Cu in an exposed area from a first opening made on the metal pad and the proximity of the area formed on an insulating layer as a lower layer, covering the chip surface containing the metal electrode pad contacted to the semiconductor element.

6. The method of manufacturing a semiconductor device as claimed in claim 5, wherein the step of removing the seed layer comprises the step of polishing the semiconductor wafer or etching the seed layer by using the remained solder as an element of a mask.

7. The method of manufacturing a semiconductor device as claimed in claim 5, further comprising the step of forming an $Si_3N_4$ film after the step of forming the wiring layer, prior to the step of forming the insulating layer.

8. The method of manufacturing a semiconductor device as claimed in claim 7, wherein the step of forming the seed layer comprises the step of physically depositing a Cu thin film and further the step of forming a Cu film on the Cu thin film by plating.

9. The method of manufacturing a semiconductor device as claimed in claim 8, wherein the step of forming the seed layer includes the step of forming a copper thin film by sputtering, the copper plating step, the nickel plating step, and the gold plating step.

10. The method of manufacturing a semiconductor device as claimed in claim 1, wherein the melting point of the solder formed in the opening is substantially higher than that of the conductive ball formed on a surface of the solder, about 2° C. to 5° C.

11. The method of manufacturing a semiconductor device as claimed in claim 1, wherein the melting point of said solder in the opening is about 2° C. to 5° C. higher than that of the solder ball.

* * * * *